(12) United States Patent
Yamagata

(10) Patent No.: US 7,214,567 B2
(45) Date of Patent: May 8, 2007

(54) METHOD OF PRODUCING SEMICONDUCTOR PACKAGE, APPARATUS FOR PRODUCING SEMICONDUCTOR PACKAGE, AND ADHESIVE FILM

(75) Inventor: Osamu Yamagata, Kanagawa (JP)

(73) Assignee: Sony Corporation (JP)

( * ) Notice: Subject to any disclaimer, the term of this patent is extended or adjusted under 35 U.S.C. 154(b) by 250 days.

(21) Appl. No.: 10/942,821

(22) Filed: Sep. 17, 2004

(65) Prior Publication Data
US 2005/0074921 A1   Apr. 7, 2005

(30) Foreign Application Priority Data
Oct. 2, 2003   (JP)   ............... 2003-344592

(51) Int. Cl.
*H01L 21/00*   (2006.01)
(52) U.S. Cl. .............. 438/110; 438/118; 438/106; 257/E21.499; 257/E23.001
(58) Field of Classification Search ......... 438/106, 438/110, 113, 118, FOR. 386, FOR. 142, 438/15, 26, 51, 55, 64, 460, 462, FOR. 211; 257/E21.499, E21.5, E23.001, E21.506, E23.002; 414/935–941
See application file for complete search history.

(56) References Cited

U.S. PATENT DOCUMENTS

| | | | |
|---|---|---|---|
| 5,316,853 A | 5/1994 | Shibata et al. | |
| 6,451,671 B1 * | 9/2002 | Yamada | 438/460 |
| 6,514,795 B1 | 2/2003 | Jiang et al. | |
| 2003/0034120 A1 | 2/2003 | Yanagisawa et al. | |
| 2003/0190795 A1 * | 10/2003 | Kawakami | 438/462 |

FOREIGN PATENT DOCUMENTS

| | | |
|---|---|---|
| JP | 56-120136 A | 12/1981 |
| JP | 60-224236 A | 3/1986 |
| JP | 07-045557 A | 6/1995 |
| WO | WO 03/077310 A | 9/2003 |

OTHER PUBLICATIONS

European Search Report.

* cited by examiner

*Primary Examiner*—Matthew Smith
*Assistant Examiner*—Quovaunda Jefferson
(74) *Attorney, Agent, or Firm*—Rader Fishman & Grauer PLLC; Ronald P. Kananen

(57) ABSTRACT

A method of producing a semiconductor package enabling a sheet-like adhesive film to be used as it is and thereby reducing loss and enabling mounting without the piece of adhesive film sticking out from the semiconductor chip, comprising forming cutting-off notches in an adhesive film provided on a support film from the adhesive film side down to the surface of the support film or a depth D in the middle and cutting the adhesive film to pieces of predetermined size, then stretching the support film to separate the cut individual piece of the adhesive film, attaching semiconductor chip to the cut individual piece of the adhesive film, and mounting the semiconductor chip on a substrate by the piece of adhesive film, and an apparatus for producing a semiconductor package and adhesive film for use with that method.

7 Claims, 10 Drawing Sheets

METHOD OF PRODUCING SEMICONDUCTOR PACKAGE, APPARATUS FOR PRODUCING SEMICONDUCTOR PACKAGE, AND ADHESIVE FILM

BACKGROUND OF THE INVENTION

1. Field of the Invention

The present invention relates to a method of producing a semiconductor package, an apparatus for producing a semiconductor package, and an adhesive film, more particularly relates to a method of producing a semiconductor package called "system-in-package (SiP)" and an apparatus for producing a semiconductor package and an adhesive film used for the same.

2. Description of the Related Art

Demand for reducing the size, thickness, and weight of digital video cameras, digital mobile phones, notebook computers, and other portable electronic devices has been growing increasingly stronger. To meet with this, VSLIs and other semiconductor packages have been reduced 70% in size in the past three years. On the other hand, how to raise the mounting density of components on mounting boards (printed circuit boards) has been the subject of much R&D for electronic circuit devices comprising such semiconductor packages mounted on printed circuit boards.

For example, semiconductor packages have been shifting from the DIP (dual in-line package) and other surface mounted types to flip-chip mounted types providing the pad electrodes of semiconductor chips with bumps made of solder, gold, etc. and connecting the chips to the circuit boards through the bumps in a state where the surfaces provided with bumps face the boards (face down).

Further, types forming multilayer interconnects also known as reinterconnect layers on the semiconductor chips and the complicated types known as "system-in-packages (SiP)" packaged by burying coils or other passive devices or other semiconductor chips between insulating layers insulating the reinterconnect layers formed on the semiconductor chips are being developed.

As the method of producing a semiconductor package burying other semiconductor chip between the insulating layers insulating the reinterconnect layers formed on semiconductor chip, the method of die bonding other semiconductor chip (hereinafter sometimes simply referred to as "semiconductor chip") on semiconductor chip serving as a substrate (hereinafter sometimes simply referred to as "substrate") and forming insulating layers comprised of resin layers containing the reinterconnect layers covering the same is widely known.

In this method of producing a semiconductor package, as the method of die bonding the semiconductor chip on the substrate, the method of grinding down the wafer from the back side when the semiconductor chip is supplied in the wafer state before dicing, laminating a die-attach film (adhesive film) in the wafer state, dicing the wafer to obtain the individual semiconductor chips, and mounting the obtained semiconductor chip to the substrate face up or face down is widely used.

On the other hand, when the semiconductor chips are supplied in a state already separated into individual units, usually they are supplied on 4 inch diameter chip trays and are mounted face up or face down on the substrates of the SiPs by die bonding. Here, there are restrictions derived from the multiple layers in the wafer state and the resin forming the SiPs etc., so the semiconductor chips of the SiP have to be reduced in thickness to about 50 μm. The individually separated semiconductor chips are reduced in thickness by the following procedure. That is, a package use monitor wafer is attached to the center of a protective tape for use in grinding down the semiconductor chips, the individually separated semiconductor chips are arranged around it, and the chips are ground down while monitoring the thickness of the monitor wafer.

The ground down thin semiconductor chip is then reattached to transfer sheet etc. for mounting on the substrate and supplied to a die bonder. Here, for example when using an insulating paste in a die bonder for bonding face up, a scrubbing operation becomes necessary to make the paste a uniform thickness. However, thin semiconductor chip lacks strength and is liable to break, so cannot be scrubbed. Therefore, thin semiconductor chip cannot be bonded by paste. Accordingly, thin semiconductor chip is bonded using a uniform thickness die-attach film.

A die-attach film, as shown in the schematic view of FIG. 1, is usually supplied in the form of a roll R1. This has a width W1 far greater than the width of the semiconductor chip, so at the time of actual use, as shown in the schematic view of FIG. 2, it is cut corresponding to the width W2 of the semiconductor chip to obtain the roll R2. As shown in the schematic view of FIG. 3, the film is fed out and cut from the roll R2 by a cutter 100 into the size of the semiconductor chip. The semiconductor chip 102 is then bonded to the thus obtained predetermined sized piece of die-attach film 101 using a collet 103. The thus obtained semiconductor chip with the piece of die-attach film bonded to it is transported by a suction collet to the substrate and mounted on the substrate.

In the above method however, it is necessary to prepare a roll cut to the width of the chip. When handling several types of semiconductor chips of different sizes, the loss ends up becoming greater. Further, precise bonding to the semiconductor chip after cutting is difficult. The piece of die-attach film easily sticks out from the semiconductor chip. When actually sticking out, the part where the piece of die-attach film stick out lacks photosensitivity and via holes cannot be formed, so interconnect defects are liable to occur.

Summarizing the problems to be solved by the invention, when mounting an individually separated thin semiconductor chip on a substrate, the loss of the die-attach film (adhesive film) is great and the piece of die-attach film sticks out from the semiconductor chip to easily cause an interconnect defect.

SUMMARY OF THE INVENTION

An object of the present invention is to provide a method of producing a semiconductor package enabling a sheet-like adhesive film to be used as it is and thereby reducing loss and enabling mounting without the piece of the adhesive film sticking out from the semiconductor chip and an apparatus for producing a semiconductor package and an adhesive film for use with that method.

According to a first aspect of the present invention, there is provided a method of producing a semiconductor package mounting a semiconductor chip on a substrate by an adhesive film, comprising the steps of forming cutting-off notches in the adhesive film provided on a support film from the adhesive film side down to a surface or a midway depth of the support film to cut-off the adhesive film into predetermined sized pieces; stretching the support film to separate the adhesive film into the cut individual pieces; attaching a semiconductor chip to the cut individual piece of the adhesive film; and mounting the semiconductor chip on the substrate by the piece of adhesive film.

According to a second aspect of the present invention, there is provided an apparatus for producing a semiconductor package mounting a semiconductor chip on a substrate by an adhesive film, comprising a support which supports a support film on which an adhesive film having cutting-off notches into a plurality of pieces having a predetermined size is provided; a pushup tool having a rounded tip which pushes up the support film from the back side of the surface on which the adhesive film is provided so as to stretch the support film and separate the adhesive film into the cut individual pieces; a suction unit which picks up the semiconductor chip by suction and attaches the semiconductor chip to the individual cut piece of adhesive film and which picks up by suction the semiconductor chip on which the piece of adhesive film is attached and mounts the semiconductor chip on the substrate.

According to a third aspect of the present invention, there is provided an adhesive film for bonding a semiconductor chip to a substrate, provided on a support film, and having cutting-off notches from the adhesive film side down to a surface or a midway depth of the support film, for cutting-off the adhesive film into a plurality of pieces having a predetermined size.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the method of producing a semiconductor package, an apparatus for producing a semiconductor package, and an adhesive film according to the present invention will be described in detail below while referring to the attached figures.

First Embodiment

The semiconductor package according to the present embodiment is an SiP type semiconductor package comprising semiconductor chip serving as a substrate (hereinafter sometimes simply called "substrate") on which other semiconductor chip (hereinafter sometimes simply called "semiconductor chip") is die bonded and covered by insulating layers comprising resin layers including reinterconnect layers. The semiconductor chip and substrate are provided with predetermined semiconductor devices and electronic circuits and are connected with each other by the reinterconnect layers whereby the semiconductor chip and substrate are joined.

Such semiconductor chip is supplied in individually separated state and is reduced in thickness to about 50 µm for being buried in the insulating layers. This thinning process is performed for example by attaching a height gauge monitor wafer to the center of a protective tape for use for grinding down the semiconductor chips, attaching individually separated semiconductor chips around it, and monitoring the thickness of the monitor wafer while grinding them down. The thus thinned semiconductor chip is mounted on the substrate face up by a die-attach film (adhesive film) and set into the SiP.

Figure 1:
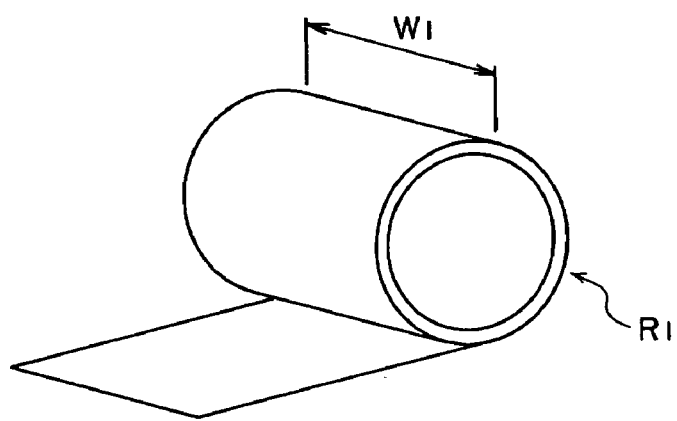
FIG. 1 is a schematic view of the configuration of a die-attach film of the related art.
Figure 2:
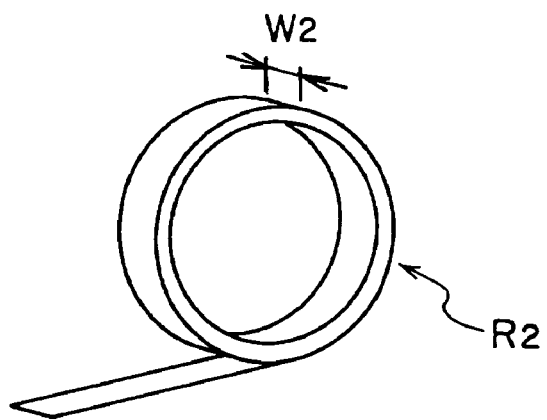
FIG. 2 is a schematic view of the configuration of a die-attach film of the related art.
Figure 3:
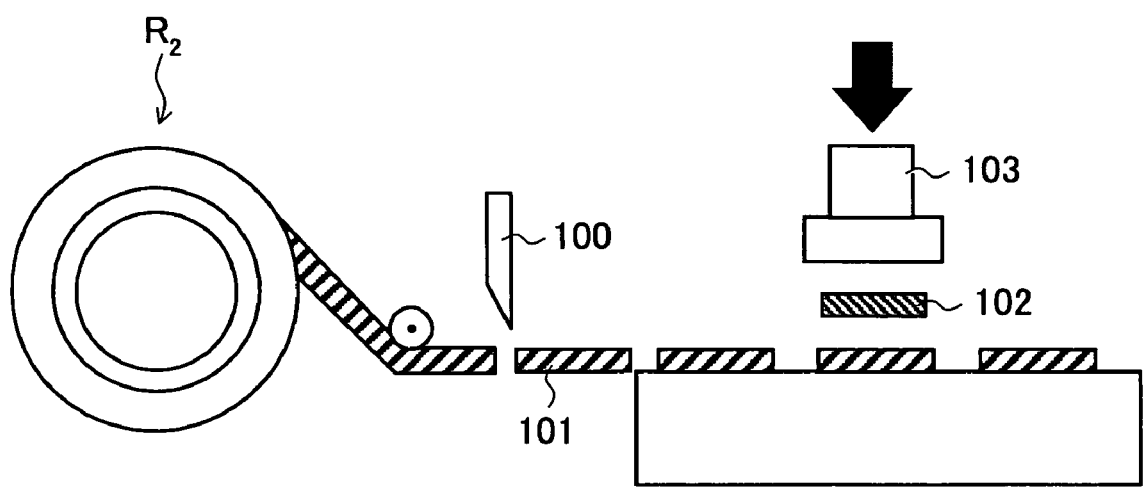
FIG. 3 is a schematic view of the steps of production of semiconductor packages according to the related art.
Figure 4:
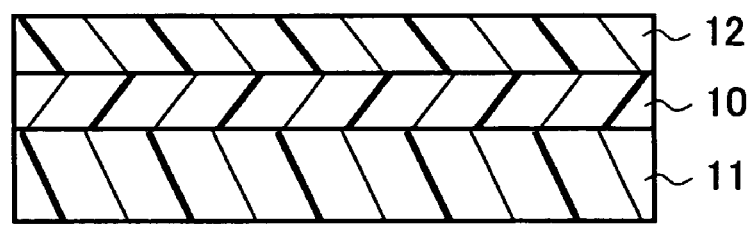
FIG. 4 is a cross-sectional view of a die-attach film according to a first embodiment of the present invention at the time of supply (before use)

FIG. 4 is a cross-sectional view of a die-attach film at the time of supply (before use). For example, a 10 to 50 µm thick die-attach film 10 comprised of an epoxy resin or other adhesive resin is supplied sandwiched between a 50 µm thick support film 11 comprised of polyethylene terephthalate (PET) etc. and a 20 µm thick cover film 12 comprised of the same PET. At the time of use, first, the cover film 12 is peeled off from the die-attach film 10, the semiconductor chip to be bonded is attached to the die-attach film 10, then the support film 11 is peeled off and the die-attach film is used to bond the semiconductor chip to the substrate.

Next, the method of producing a semiconductor package by mounting semiconductor chip on a substrate by the above die-attach film according to the present embodiment will be explained. First, the cover film 12 provided on the die-attach film 10 is peeled off, cuts are made into the die-attach film 10 provided on the support film 11, then the die-attach film 10 is separated into predetermined sized pieces.

Figure 5:
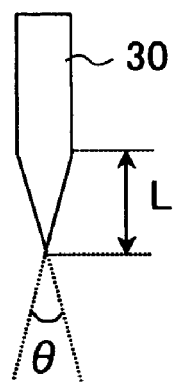
FIG. 5 is a schematic view of the configuration of a regular blade in the first embodiment of the present invention.

Here, to make cuts in the die-attach film, for example a regular blade 30 of the configuration shown in the schematic view of FIG. 5 is used. This is configured by a disk-shaped base at the outer rim of which a die cutting blade is provided.

FIG. 5 corresponds to a cross-sectional view of a plane perpendicular to the surface of a disk. For example, the length L of the blade is about 0.5 μm, and the tip angle θ of the blade is 7 to 13°. The surface is formed with a fluorine-based film so as help prevent sticking by the resin ingredient forming the die-attach film when cutting the die-attach film.

Figure 6:
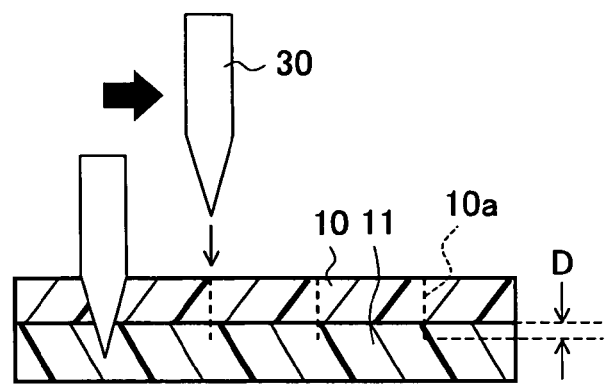
FIG. 6 is a schematic view of the steps of production of a semiconductor package according to the first embodiment of the present invention.
Figure 7:
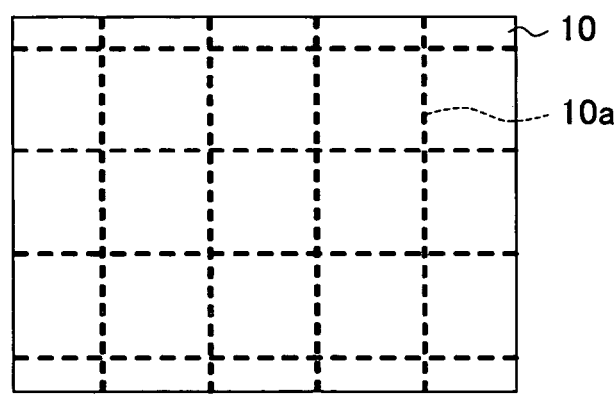
FIG. 7 is a plan view of cuts made in a die-attach film according to the first embodiment of the present invention.

When making cuts into the die-attach film 10, as shown in the schematic view of FIG. 6, in the die-attach film 10 provided on the support film 11, cutting-off notches 10a are formed using the regular blade 30 from the die-attach film 10 side down to a depth (D) midway in the support film 11. That is, the die-attach film 10 is cut so as to prevent complete cutting of the support film 11. The depth D of the cutting-off notches 10a made into the support film 11 is for example 10 μm. When making cuts into the die-attach film 10 in this way, for example as shown in the plan view of FIG. 7, the cutting-off notches 10a are made in a checkerboard manner corresponding to the size of the semiconductor chip. When cutting the die-attach film into predetermined sized pieces by this method, even if supplying a sheet-like die-attach film from a roll having a width larger than the width of the semiconductor chip, cutting into predetermined size becomes possible and any sized pieces of die-attach film can be supplied.

At this time, it is preferable to cut the film to pieces of size not exceeding the size of the semiconductor chip even after stretching the adhesive film in the later step of stretching the support film. That is, the size of the cut out piece of the die-attach film is made smaller than the size of the semiconductor chip bonded using it. This is because when stretching the support film in the later step to separate the adhesive film into the individual pieces of die-attach film, the piece of the die-attach film itself also ends up being stretched. This practice therefore prevents it from sticking out from the semiconductor chip even in the stretched state. Specifically, the piece is cut to be about 50 μm smaller than the two sides of the semiconductor chip.

Figure 8:
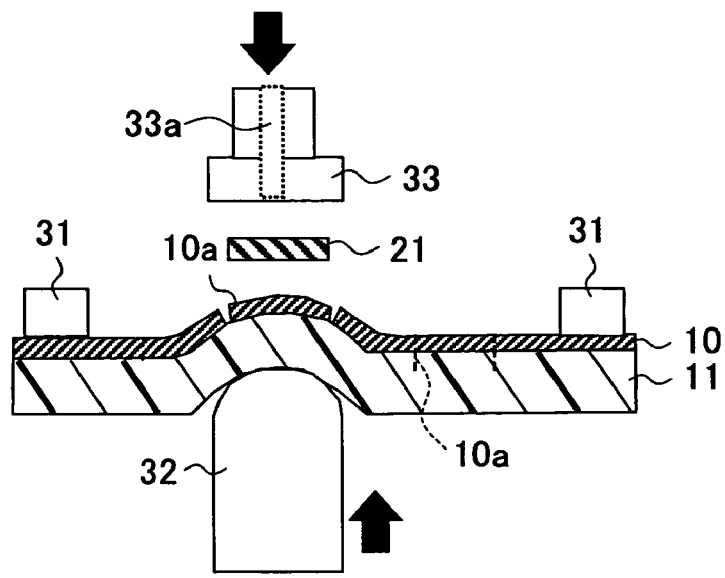
FIG. 8 is a schematic view of the steps of production of a semiconductor package according to the first embodiment of the present invention.

Next, the support film 11 is stretched to separate the adhesive film 10 into the individual pieces. In the present embodiment, as the apparatus for producing a semiconductor package performing this step, the die bonder shown in the schematic view of FIG. 8 is used. The die bonder of FIG. 8 is an apparatus for producing a semiconductor package mounting semiconductor chip on substrate by a die-attach film and has a support ring (support part) 31 called a "dicing ring", a pushup collet (pushup tool) 32, and a suction collet (suction unit) 33. The support ring 31 supports the support film 11 on which the die-attach film 10 cut to predetermined sized pieces in the above step is provided and is set at a wafer chuck in that state. The pushup collet 32 has a rounded tip and pushes up the support film 11 from the back side of the surface where the die-attach film 10 is provided so as to stretch the support film 11 and separate the die-attach film 10 into the cut individual pieces at the cuts 10a. The pushup collet 32 is provided instead of the pushup needles usually provided at a die bonder for pushing up the semiconductor chip and peeling it off from the support film and enables utilization of existing apparatus with the minimum modification. The distance of separation between pieces of the die-attach film 10 due to the pushup is made about 50 to 100 μm and the radius of curvature of the tip of the pushup collet 32 is made about 10 times the size of the semiconductor chips. The suction collet 33 applies suction from a suction hole 32a and can pick up a semiconductor chip 21 by suction. This will be explained later.

By using the die bonder and pushing up the support film 11 by the pushup collet 32 from the back side of the surface where the die-attach film 10 is provided, the support film 11 can be stretched so as to separate the adhesive film into the cut individual pieces at the cuts 10a.

Figure 9:
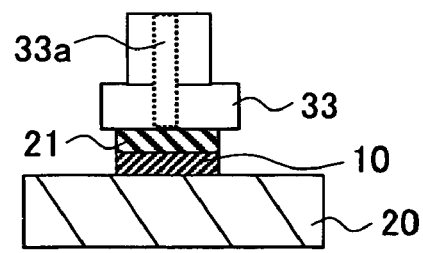
FIG. 9 is a schematic view of the steps of production of a semiconductor package according to the first embodiment of the present invention.

Next, semiconductor chip reduced in thickness to about 50 μm is attached to the cut individual piece of the die-attach film 10, then the semiconductor chip 21 is mounted on substrate 20 by the piece of the die-attach film 10. This step is performed using the suction collet 33 of the die bonder. The suction collet 33 has the function of applying suction from a built-in suction hole 33a to pick up a semiconductor chip 21 by suction. As shown in the schematic view of FIG. 8, the semiconductor chip 21 is attached to the individually separated piece of the die-attach film 10 and, as shown in the schematic view of FIG. 9, the semiconductor chip 21 with the die-attach films 10 attached to it is picked up by suction and mounted on the substrate 20. The suction collet 33 includes a not shown pulse heater. When for example attaching the semiconductor chip 21 on the die-attach film 10, it is heated at a temperature of 60 to 80° C. for about 3 seconds. Due to this, it is possible to prevent the occurrence of voids in the die-attach film 10. At this time, the weighting applied to the suction collet is made for example 1N per chip. Here, to attach the semiconductor chip 21 to the die-attach film 10, the position of the semiconductor chip is image processed before pushing up the cut positions which are made to the die-attach film 10 by the pushup collet and the obtained data is used for positioning for the attachment. Further, when mounting the semiconductor chip 21 on which the die-attach film 10 are attached on the substrate 20 as well, it is heated by a pulse heater at a temperature of 60 to 80° C. for about 3 seconds. Further, as post-bake treatment, each substrate is heated to a temperature of 140 to 160° C. to enable complete bonding.

As subsequent steps, for example, the semiconductor chip 21 die-bonded on the substrate 20 by the piece of the die-attach film 10 is covered by the formation of reinterconnect layers for electrically connecting the semiconductor chip 21, substrate 20, and coil and other passive devices and insulating layers comprising resin layers including the same so as to produce SiP type semiconductor package.

According to the method of producing a semiconductor package of the present embodiment, by introducing a step of bonding a piece of die-attach film to thinned, individually separated semiconductor chip and a step of mounting it on substrate, it becomes possible to attach the die-attach film to any shape of chip. Further, by introducing the method of forming cutting-off notches in the die-attach film in the sheet form, it is possible to handle different shapes by just changing the pushup tool section of the die bonder corresponding to usual wafers. Further, the die-attach film and semiconductor chip can be aligned at a high precision by employing a die bonder and therefore protrusion of the piece of the die-attach film from the semiconductor chip can be kept to a minimum. In this way, according to the method of producing semiconductor package of the present embodiment, it is possible to use a sheet-like adhesive film as it is, so there is little loss and mounting is possible without the piece of adhesive film sticking out from the semiconductor chip. Therefore, it is possible to produce a semiconductor package while suppressing the interconnect defect.

According to the apparatus for producing semiconductor package of the present embodiment, it is possible to realize the method of producing a semiconductor package of the present embodiment. Further, it is possible to separate the sheet-type adhesive film having cutting-off notches in accordance with the semiconductor chip into the individual piece of adhesive film and mount the semiconductor chip on the substrate by the piece of adhesive film.

The die-attach film of the present embodiment can be used in the method of producing a semiconductor package of the present embodiment and enables the semiconductor chip to be bonded on a substrate without sticking out from the semiconductor chip.

Second Embodiment

Figure 10:
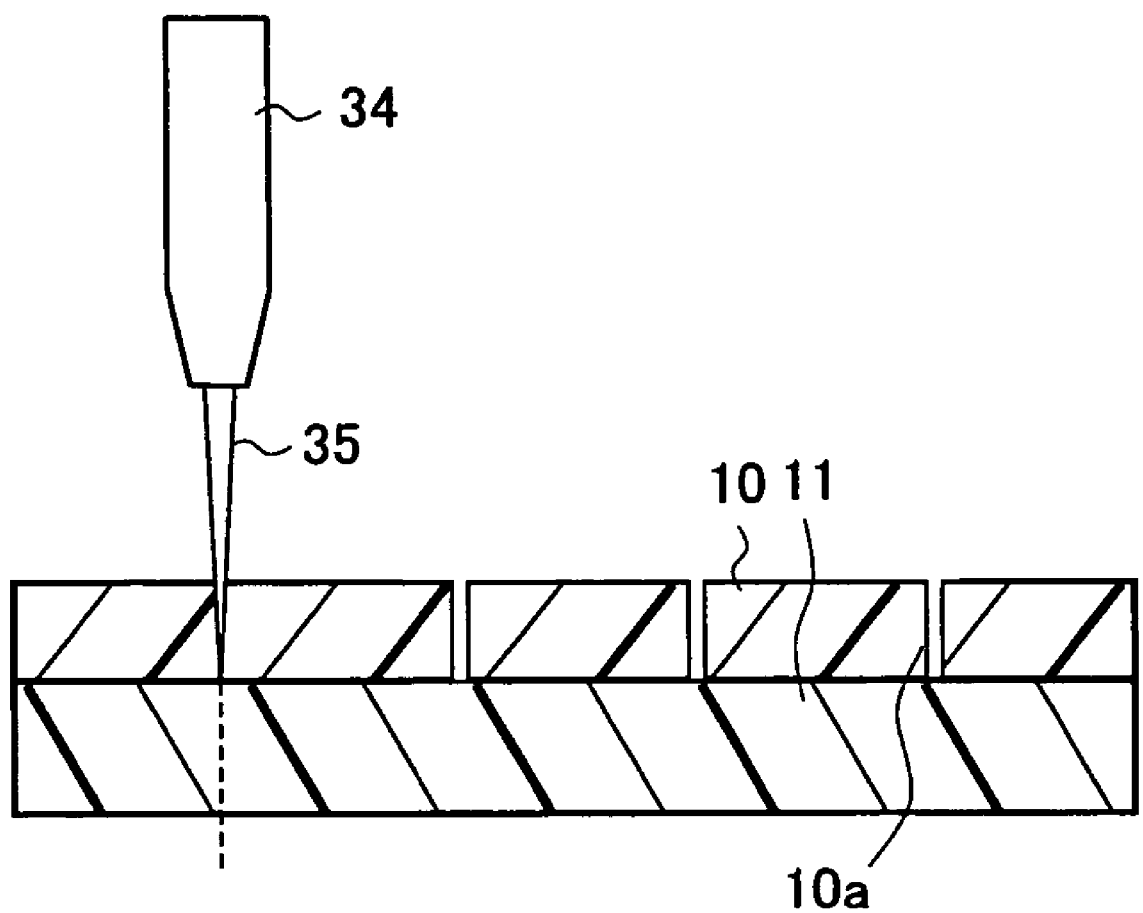
FIG. 10 is a schematic view of the steps of production of a semiconductor package according to a second embodiment of the present invention.

The method of producing a semiconductor package according to the present embodiment is substantially the same as the first embodiment, but instead of using the regular blade 30 comprising the disk-shaped base provided at its outer rim with a die cutting blade in the step of cutting the die-attach film into pieces of predetermined size corresponding to the individual semiconductor chip, as shown in the schematic view of FIG. 10, for the die-attach film 10 provided on the support film 11 cutting-off notches 10a are formed by a laser beam 35 of a wavelength absorbed by the die-attach film 10 and substantially not absorbed by the support film 11 comprising PET etc. from a laser light source 34. For example, it is possible to use a YAG laser or $CO_2$ laser. The laser beam 35 passes through the support film 11 and is not absorbed, so it is possible to form cutting-off notches in the die-attach film 10 provided on the support film 11 from the die-attach film 10 side down to the surface of the support film 11 and cut the die-attach film 10 into predetermined sized pieces. Aside from this, it is possible to follow substantially the same procedure as the first embodiment.

According to the method of producing a semiconductor package of the present embodiment, in the same way as the first embodiment, it is possible to use a sheet-like adhesive film as it is, so there is little loss and mounting is possible without the piece of adhesive film sticking out from the semiconductor chip. Therefore, it is possible to produce a semiconductor package while suppressing the interconnect defect.

Third Embodiment

The method of producing a semiconductor package according to the present embodiment is substantially the same as that of the first embodiment, but it differs from it in that in the step of stretching the support film to separate the adhesive film into the individual cut pieces, no die bonder of FIG. 8 is used, that is, the following method is used for separation.

Figure 11:
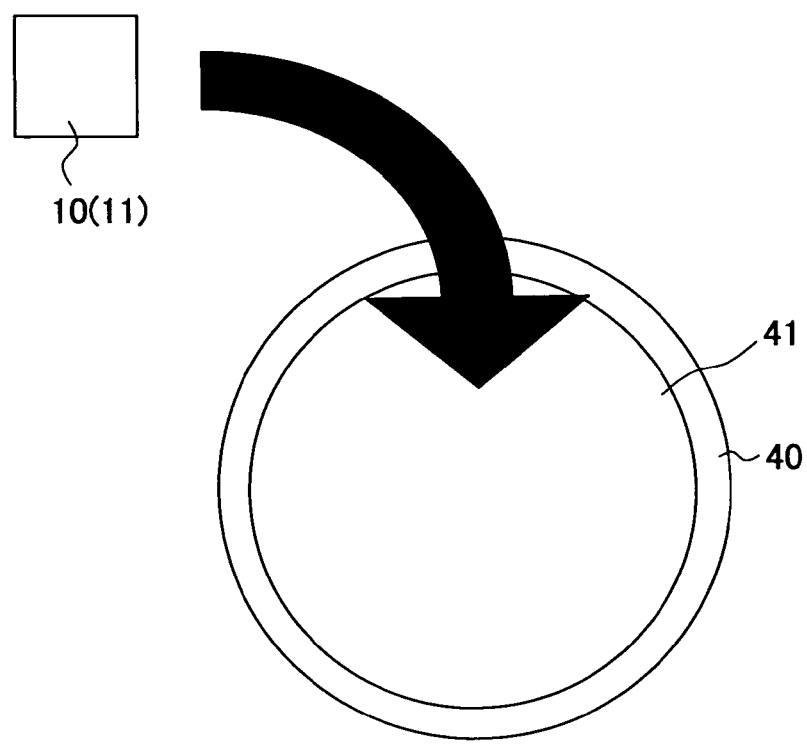
FIG. 11 is a schematic view of the steps of production of a semiconductor package according to a third embodiment of the present invention.

The method of producing a semiconductor package according to this embodiment will be explained below. First, as shown in the schematic view of FIG. 11, a support film (UV sheet) 41 is attached to a support ring (wafer ring) 40, then a rolling transfer method or other technique is used to transfer and bond the die-attach film 10 with the support film 11 to the support film 41.

Figure 12:
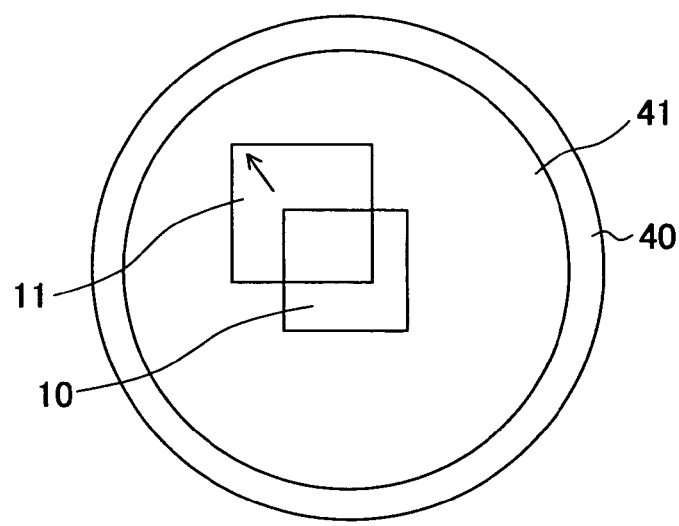
FIG. 12 is a schematic view of the steps of production of a semiconductor package according to the third embodiment of the present invention.

Next, as shown in the schematic view of FIG. 12, the support film 11 is peeled off from the die-attach film 10. With this, only the die-attach film 10 is present on the support film 41.

Figure 13:
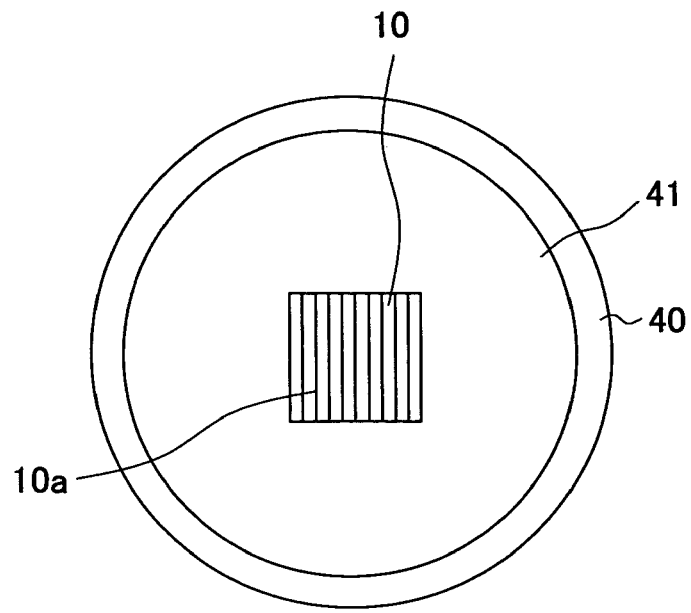
FIG. 13 is a schematic view of the steps of production of a semiconductor package according to the third embodiment of the present invention.
Figure 14:
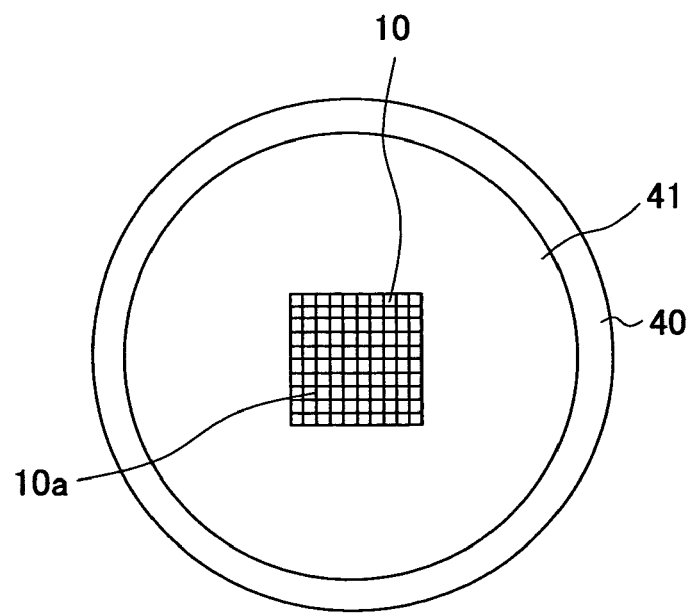
FIG. 14 is a schematic view of the steps of production of a semiconductor package according to the third embodiment of the present invention.

Next, a Thomson bar is used to form cutting-off notches in the die-attach film 10 provided on the support film 41 from the die-attach film 10 side down to a depth in the middle of the support film 41 for cut-off the die-attach film 10 to predetermined sized pieces. That is, first, as shown in the schematic view of FIG. 13, cutting-off notches 10a parallel to one direction are formed. Next, as shown in FIG. 14, the notch direction is rotated 90 degrees and cutting-off notches 10a are formed in another direction substantially perpendicular to that one direction for cutting-off the film into rectangular shapes.

In cutting the die-attach film 10, care is taken not to completely cut the support film 41. The die-attach film 10, in the same way as the first embodiment, is cut into pieces smaller in size in advance considering the fact that they becomes larger in the following stretching step.

Figure 15:
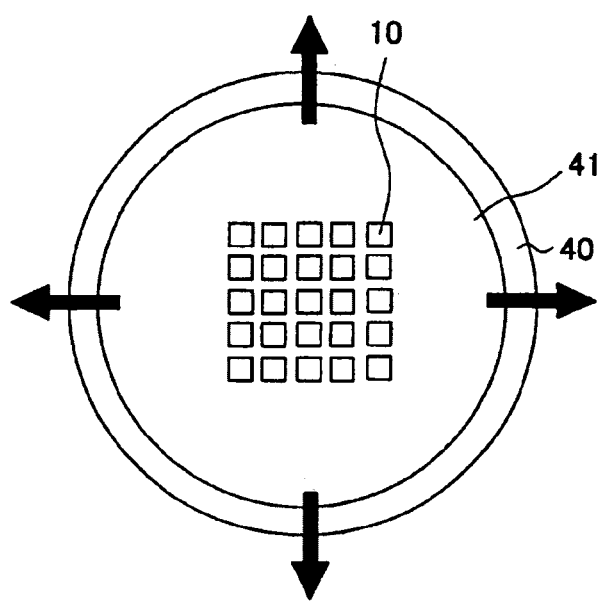
FIG. 15 is a schematic view of the steps of production of a semiconductor package according to the third embodiment of the present invention.

Next, as shown in the schematic view of FIG. 15, the support film is attached to the support ring, then an expander is used to stretch the support film 41 in the radial directions from the center of the support ring 40. At this time, the cut die-attach film 10 is also similarly stretched. According to this, the intervals between the pieces of the die-attach film 10 are also stretched and the film is separated into the individual pieces of die-attach film 10. Here, the distance between cut pieces of the die-attach film 10 is set to become at least 0.3 mm.

Figure 16:
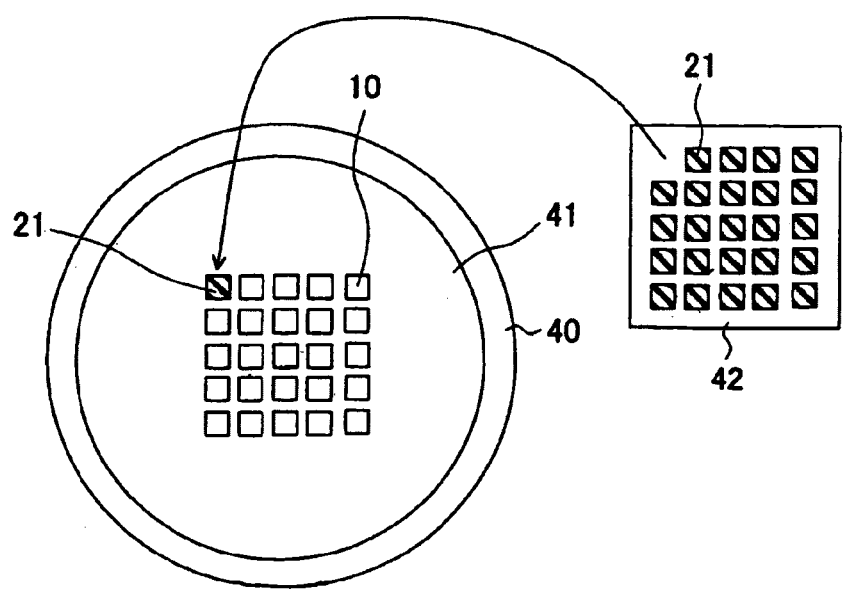
FIG. 16 is a schematic view of the steps of production of a semiconductor package according to the third embodiment of the present invention.

Next, as shown in the schematic view of FIG. 16, semiconductor chip 21 reduced in thickness in advance and placed on a stackable and automatically feedable waffle tray 42 are supplied. Using a not shown collet etc., the semiconductor chip 21 is attached to the individually separated piece of the die-attach film 10 with reference to their outer shapes. By using their outer shapes as reference, the mounting precision becomes about ±15 μm. Here, the center of gravity and angle of each chip are checked by image processing etc. and the chip is adjusted to the suitable direction for bonding. The size of a semiconductor chip 21 is for example 3.55 mm×4.7 mm with a thickness of 0.025 mm.

Figure 17:
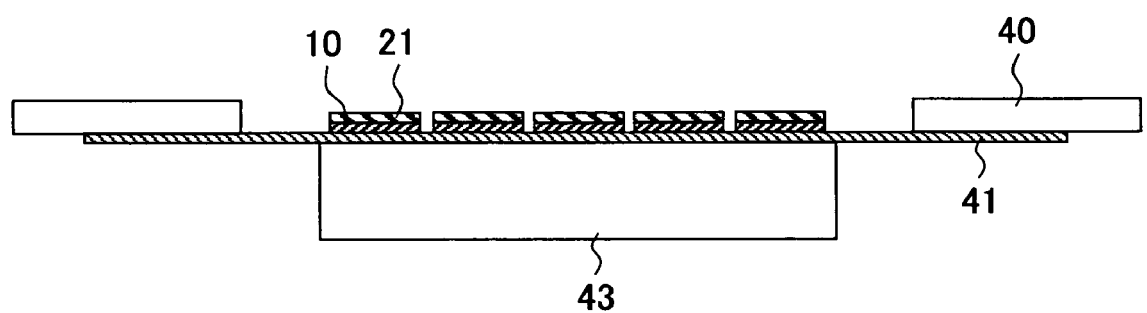
FIG. 17 is a schematic view of the steps of production of a semiconductor package according to the third embodiment of the present invention.

Next, as shown in the schematic view of FIG. 17, the support ring 40 is held and moved and a heater 43 is used to heat the piece of the die-attach film 10 to a predetermined temperature for a predetermined time through the support film 41. After finishing the heating, the film is set in the die bonder as it is, where the semiconductor chip 21 to which the piece of the die-attach film 10 is attached is peeled off from the support film 41 and die bonded to the substrate. The rest of the steps are the same as in the first embodiment.

According to the method of producing a semiconductor package of the present embodiment, it is possible to use a sheet-like adhesive film as it is in the same way as in the first embodiment, so the loss is small and mounting is possible without the pieces of the adhesive film sticking out from the semiconductor chip. Therefore, the interconnect defect can be suppressed in production.

The present invention is not limited to the above examples. For example, the SiP type semiconductor package may have embedded in the resin layers formed on the semiconductor chip serving as the substrate not only other semiconductor chip, but also coil and other passive devices and other electronic devices.

The method of production of a semiconductor package of the present invention may be applied to the production of a system-in-package type semiconductor package. Further, the apparatus for producing a semiconductor package of the present invention may be applied to an apparatus for producing a system-in-package type semiconductor package for working the method of producing a semiconductor package of the present invention. Further, the die-attach film of the present invention may be applied to a die-attach film for die bonding a semiconductor chip on a substrate for working the method of producing a semiconductor package of the present invention.

While the invention has been described with reference to specific embodiments chosen for purpose of illustration, it should be apparent that numerous modifications could be made thereto by those skilled in the art without departing from the basic concept and scope of the invention.

The method of producing a semiconductor package of the present invention enables a sheet-like adhesive film to be used as it is, so reduces loss. Further, it enables mounting without the piece of adhesive film sticking out from the semiconductor chip, so a semiconductor package can be produced while suppressing interconnect defects.

The apparatus for producing a semiconductor package of the present invention enables the method of producing a semiconductor package of the present invention to be realized and enables sheet-like adhesive film having cutting-off notches corresponding to the semiconductor chip to be separated into individual pieces of adhesive film and mounting of the semiconductor chip on a substrate by the piece of adhesive film.

The adhesive film of the present invention can be used in the method of producing a semiconductor package of the present invention and enables a semiconductor chip to be bonded to a substrate without sticking out of the film from the semiconductor chip.

What we claim is:

1. A method of producing a semiconductor package mounting a semiconductor chip on a substrate by an adhesive film, comprising the steps of;
    forming cutting-off notches in said adhesive film provided on a support film from the adhesive film side down to a surface or a midway depth of said support film to cut-off said adhesive film into predetermined sized pieces;
    stretching said support film to separate said adhesive film into the cut individual pieces;
    attaching a semiconductor chip to said cut individual piece of the adhesive film; and
    mounting said semiconductor chip on said substrate by said piece of adhesive film.

2. A method of producing a semiconductor package as set forth in claim 1, wherein in the step of cutting said adhesive film into the predetermined sized pieces, the adhesive film is cut by a regular blade.

3. A method of producing a semiconductor package as set forth in claim 1, wherein in the step of cutting said adhesive film is cut into the predetermined sized pieces, said adhesive film is cut by focusing a laser beam of a wavelength not absorbed by said support film on the adhesive film.

4. A method of producing semiconductor packages as set forth in claim 1, wherein in the step of cutting said adhesive film into the predetermined sized pieces, said adhesive film is cut into sizes so as not to exceed the sizes of the semiconductor chips even after said adhesive film is stretched in the step of stretching said support film.

5. A method of producing a semiconductor package as set forth in claim 1, wherein the step of stretching said support film is performed by pushing up said support film from the back side of the surface on which said adhesive film is provided by a pushup tool which has a rounded tip.

6. A method of producing a semiconductor package as set forth in claim 1, wherein in the step of stretching said support film, said support film is attached to a support ring and stretches said support film in the radial directions from a center of said support ring.

7. A method of producing a semiconductor package as set forth in claim 1, wherein in the step of cutting said adhesive film into the predetermined sized pieces, the adhesive film is cut by supplying a sheet-like adhesive film having a width larger than that of said semiconductor chips.

* * * * *